United States Patent [19]

Kwak

[11] Patent Number: 5,582,772
[45] Date of Patent: Dec. 10, 1996

[54] COPPER OXIDE-FILLED POLYMER DIE ATTACH ADHESIVE COMPOSITION FOR SEMICONDUCTOR PACKAGE

[75] Inventor: Cheol W. Kwak, Kyungki-Do, Rep. of Korea

[73] Assignees: ANAM Industrial Co., Ltd., Seoul, Rep. of Korea; Amkor Electronics, Inc., Chandler, Ariz.

[21] Appl. No.: 485,936

[22] Filed: Jun. 7, 1995

[30] Foreign Application Priority Data

Jun. 16, 1994 [KR] Rep. of Korea .................. 94-13647

[51] Int. Cl.⁶ .................. H01B 1/20; H01B 1/22
[52] U.S. Cl. .................. 252/518; 524/403; 524/413
[58] Field of Search .................. 252/512, 518; 524/413, 403

[56] References Cited

U.S. PATENT DOCUMENTS

| | | | |
|---|---|---|---|
| 4,387,115 | 6/1983 | Kitamura et al. | 252/512 |
| 4,871,811 | 10/1989 | Gaku et al. | 525/148 |
| 4,877,555 | 10/1989 | Yuhaku et al. | 252/518 |
| 4,975,221 | 12/1990 | Chen et al. | 252/512 |

*Primary Examiner*—Douglas J. McGinty
*Assistant Examiner*—M. Kopec
*Attorney, Agent, or Firm*—Skjerven, Morrill, MacPherson, Franklin & Friel; Thomas S. MacDonald; Alan H. MacPherson

[57] ABSTRACT

There is disclosed a copper oxide-filled polymer die attach adhesive composition for semiconductor package The copper oxide-filled polymer die attach adhesive composition for semiconductor package is made of an adhesion resin mixture and an inorganic filler, wherein the inorganic filler includes copper oxide selected from a group consisting of $CuO$, $Cu_2O$ and the mixture thereof in an amount of approximately 0.1 to approximately 90% by weight. Optionally, silver may be contained in the composition. It is capable of maintaining electric conductivity under severe temperature cycle as well as providing bonding strength enough to prevent package crack and delamination.

6 Claims, 2 Drawing Sheets

COPPER OXIDE-FILLED POLYMER DIE ATTACH ADHESIVE COMPOSITION FOR SEMICONDUCTOR PACKAGE

BACKGROUND OF THE INVENTION

1. Field of the Invention

The present invention relates to an adhesive composition which is used to attach a semiconductor chip die on a lead frame paddle in production of semiconductor integrated circuit package. More particularly, the present invention is concerned with a copper oxide-filled polymer die attach adhesive composition, capable of maintaining electric conductivity under severe temperature cycle and providing bonding strength enough to prevent package crack and delamination.

2. Description of the Prior Art

As a die attach adhesive paste for improvement in both electrical contact with die backside and electric conductivity which are necessary in a device such as power transistor, there has usually been used a silver-filled die attach adhesive composition. Such typical die attach adhesive composition comprises a base resin such as epoxy monomers, an amine-based curing agent, a diluent such as epoxide or butyl carbitol acetate, an adhesion promoter such as silane or dicyandiamide, a thixotropic agent such as colloidal magnesium silicate, and a small amount of additives such as Si, exhibiting improved electric and thermal conductivity through the inclusion of 60 to 80% by weight of inorganic filler of silver (Ag). In case of tape type, the die attach adhesive comprises a resin mixture of phenol and nitrile-butadien rubber and an inorganic filler, such as silver.

Silver, an electrical and thermal conductive inorganic filler for such adhesive composition, is usually added in a form of flake by virtue of its superior dispersion in organic resin systems. The silver flakes can give good thixotropic control when carrying out dispersion or die placement. However, in case of silver-filled adhesive paste, characteristic fluidity of silver cannot keep electric conductivity stable when subjected to temperature cycle (T/C), so that electric resistance is extremely varied. Referring to FIG. 3, there are plotted electric resistance values of silver flake 30 with regard to time under T/C −65° C./150° C. As shown in this figure, the electric resistance of silver flake is extremely varied owing to its characteristic fluidity, which incapacitates electric conductivity from being kept stable in the silver-filled adhesive paste.

In addition, the silver-filled adhesive paste cannot provide sufficient bonding strength for the die and lead frame paddle, causing package cracks and delamination in semiconductor package. Accordingly, conventional silver-filled adhesive paste has a serious problem that the semiconductor package is lowered in reliability.

In the case that the lead frame is made of copper, since the coefficient of thermal expansion (hereinafter referred to as "CTE") of the lead frame paddle makes little difference from that of epoxy molding compound (hereinafter referred to as "EMC"), most of post mold cure (hereinafter referred to as "PMC") stresses are concentrated in the interface between the silicon chip and the lead frame paddle which are significantly mismatched with each other in CTE. The following Table 1 lists several physical properties in various materials.

TABLE 1

| Material | Young's Module GPa | Poisson's Ratio | Coeff. of Thermal Expansion α(ppm/°C.) |
|---|---|---|---|
| Silicon | 188 | 0.3 | 3 |
| Alloy 42 | 148 | 0.3 | 5 |
| Copper | 113 | 0.33 | 17 |
| EMC | 14.7 | 0.25 | 18 |

Accordingly, if the concentrated stress exceeds the bonding strength provided by adhesive to the interface between the silicon chip and the lead frame paddle, there occurs delamination. In addition, moisture in the air permeates the delaminated parts and is condensed therein until it is suddenly vaporized upon infrared reflow or vapor phase soldering. The sudden vaporization, called "pop corn phenomenon", causes package crack which deleteriously affects reliability of semiconductor package.

Referring to FIG. 1, there is shown a conventional lamination structure of semiconductor integrated circuit package 10. As shown in this figure, a semiconductor chip 11 is mounted on a lead frame paddle 12 through a die attach adhesive 14 with an EMC 15 encompassing all of them.

It is generally recognized that bonding strength is relatively weak at an interface between the EMC and a fillet portion 16 of silver-containing adhesive. This is because silver dispersed on the surface of the fillet cannot make a chemical bond with an epoxy ring

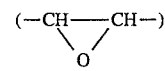

of EMC. As a result, not only is good adhesion unaccomplished, but also PMC marginal delamination is apt to occur.

In addition, since the fillet portions are located at a corner and an edge of the die which both are stressed with more shear stress than any other part of the die, the delamination caused by CTE mismatch is highly prone to occur at the fillet. Such delaminated portions are permeated with the moisture of the atmosphere, to cause cracks along a wall of the chip on a surface of the package or package cracks along the lead frame paddle.

SUMMARY OF THE INVENTION

An object of the present invention, therefore, is to overcome the above problems encountered in prior arts and to provide a novel die attach adhesive composition for semiconductor package, capable of maintaining stable electric conductivity even under severe temperature cycles as well as providing bonding strength sufficient to prevent package crack and delamination in semiconductor package.

In accordance with the present invention, the above object could be accomplished by a provision of a copper oxide-filled polymer die attach adhesive composition for semiconductor package comprising an adhesion resin mixture and an inorganic filler, wherein the inorganic filler comprises copper oxide selected from a group consisting of CuO, $Cu_2O$ and the mixture thereof in an amount of approximately 0.1 to approximately 90% by weight.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PRESENT INVENTION

Figure 1:
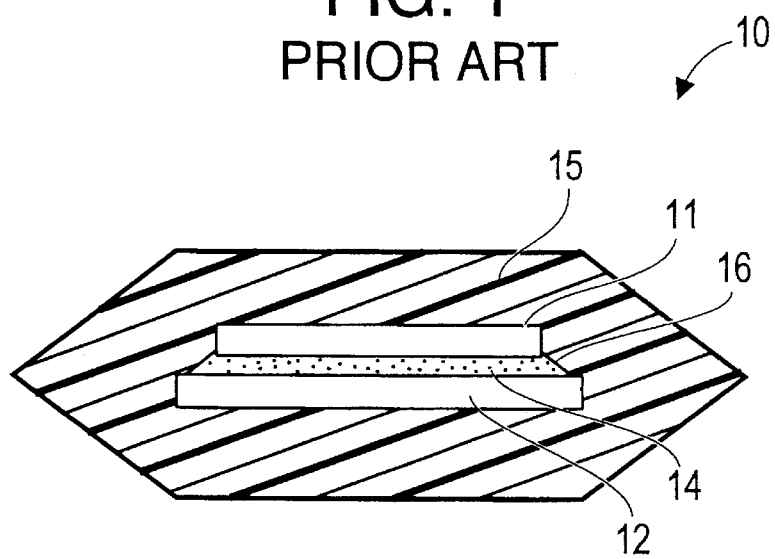
FIG. 1 is a schematic cross sectional view showing a lamination structure of usual semiconductor integrated circuit package.

In accordance with the present invention, a copper oxide is contained in a die attach adhesive composition and plays a role of electrically and thermally conductive filler therein. Copper oxide is chemically even more stable than silver (Ag) because silver has strong ion migration and can provide a die attach adhesive with stable electric conductivity even under T/C condition.

Copper oxide used in the adhesive composition of the present invention is preferably selected from a group consisting of CuO, $Cu_2O$ and the mixture thereof and, more preferably, CuO.

In accordance with the present invention, the copper oxide filler is preferably contained in amounts ranging from approximately 0.1 to approximately 90% by weight, based on the total weight of the adhesive composition and more preferably approximately 50 to approximately 80% by weight.

Optionally, silver may be added in the adhesive composition of the present invention in an amount of up to 10% by weight, based on the total weight of the adhesive composition. Such presence of silver in the adhesive composition of the present invention allows the resulting adhesive to have as good electrical and thermal conductivity as existing silver-filled die attach adhesives have.

Other components for the die attach adhesive composition are well known in the art and exemplified by a base resin such as epoxy monomer, an amine-based curing agent such as azo compound, a diluent such as epoxide or butyl carbitol acetate, a thixotropic agent such as colloidal magnesium silicate, CAB-O-SIL fuming silica, aluminum monostearate, aluminum distearate, aluminum tristearate, aluminum naphthenate, amine-modified and montmorillonite, an adhesion promoter such as silane ($SiH_4$) or dicyandiamide, and other inorganic additives such as silicon.

The copper oxide-filled die attach adhesive for semiconductor package can be prepared in a type of either paste or tape, according to the present invention.

Now, a description will be made in conjunction with influence of the copper oxide on reliability of semiconductor package. Since reliability of semiconductor package is largely dependent on delamination and package crack, these will be explained in detail below.

First, the oxygen atom of the copper oxide filler makes a strong hydrogen bond with the epoxy group of EMC, which leads to a provision of more powerful bonding strength to an interface between the adhesive and the EMC than in case of using existing Ag fillers. As a result, the delamination and the package crack are more efficiently prevented.

Second, the copper oxide filler forms a potent hydrogen bond with an adhesion promoter usually existing in the EMC, such as silane or silanol, thus stronger bonding strength occurs at an interface between the adhesive and the EMC than in case of using existing Ag fillers, bringing about prevention of package crack.

Third, while Ag ions themselves are easily fluidized under moisture or other circumstances, to degrade adhesiveness and electrical properties of the adhesive, copper oxide is chemically and physically stable. So, the degradation are not effected.

Finally, copper oxide forms a chemical bond with an adhesion promoter added in the adhesive paste, such as $SiH_4$ or $(NH_2)_2C=N-C=N$, to increase the bonding strength of the adhesive, which also prevents occurrence of package cracking as well as delamination.

The copper-filled adhesive composition for semiconductor package according to the present invention is preferably applied to bare copper lead frames or partially plated copper lead frames in which the brim 20 of the lead frame paddle 15 is plated with silver (Ag) 21 in a ring-plating technique in such a width as to allow down bond. This is because copper oxide filler is superior to silver filler in compatibility with bare copper 22 paddles, to which the bonding strength is related. Accordingly, the copper oxide-filled adhesive of the present invention can efficiently prevent the delamination and thus, protect the semiconductor package from cracks.

EXAMPLES 1 THROUGH 4 AND COMPARATIVE EXAMPLE 1

Die attach adhesive compositions for semiconductor package were prepared with the components and amounts given in the following Table 2.

TABLE 2

| | Composition | | | |
|---|---|---|---|---|
| | Wt % Organic | Wt % Inorganic filler | | |
| Exam. No | component | CuO | $Cu_2O$ | Ag |
| 1 | 30 | 70 | — | — |
| 2 | 30 | 40 | 25 | 5 |
| 3 | 30 | 30 | 30 | 10 |
| 4 | 30 | 10 | 59 | 1 |
| C.1 | 30 | — | — | 70 |

In the Table 2, the organic component consisted of 70 parts by weight of a base resin of epoxy monomer and 30 parts by weight of an additive comprising amine, epoxide, silane, colloidal magnesium silicate and CAB-O-SIL fuming silica.

Figure 2:
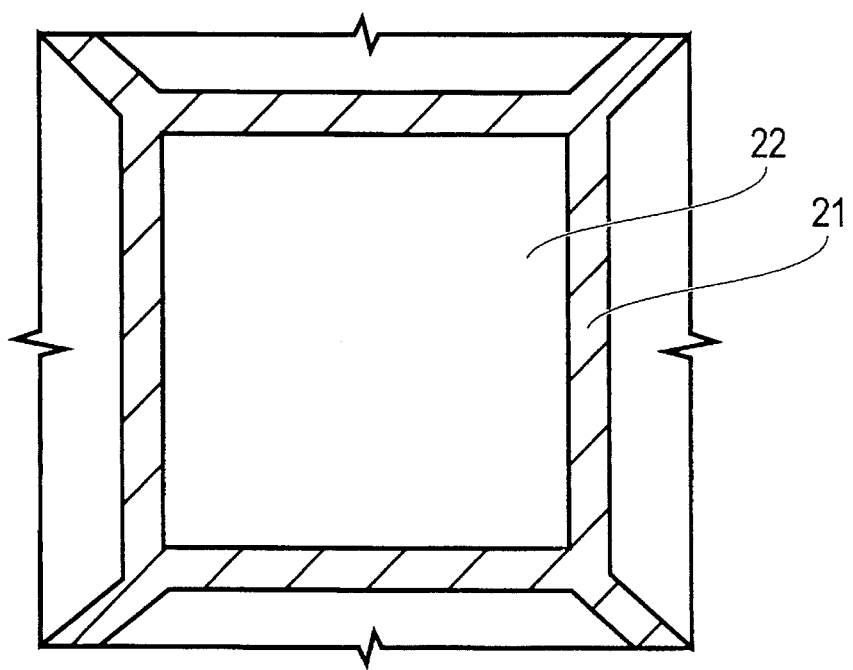
FIG. 2 is a schematic plan view showing a copper lead frame which is partially plated with silver at the brim thereof in a ring-plating technique.
Figure 3:
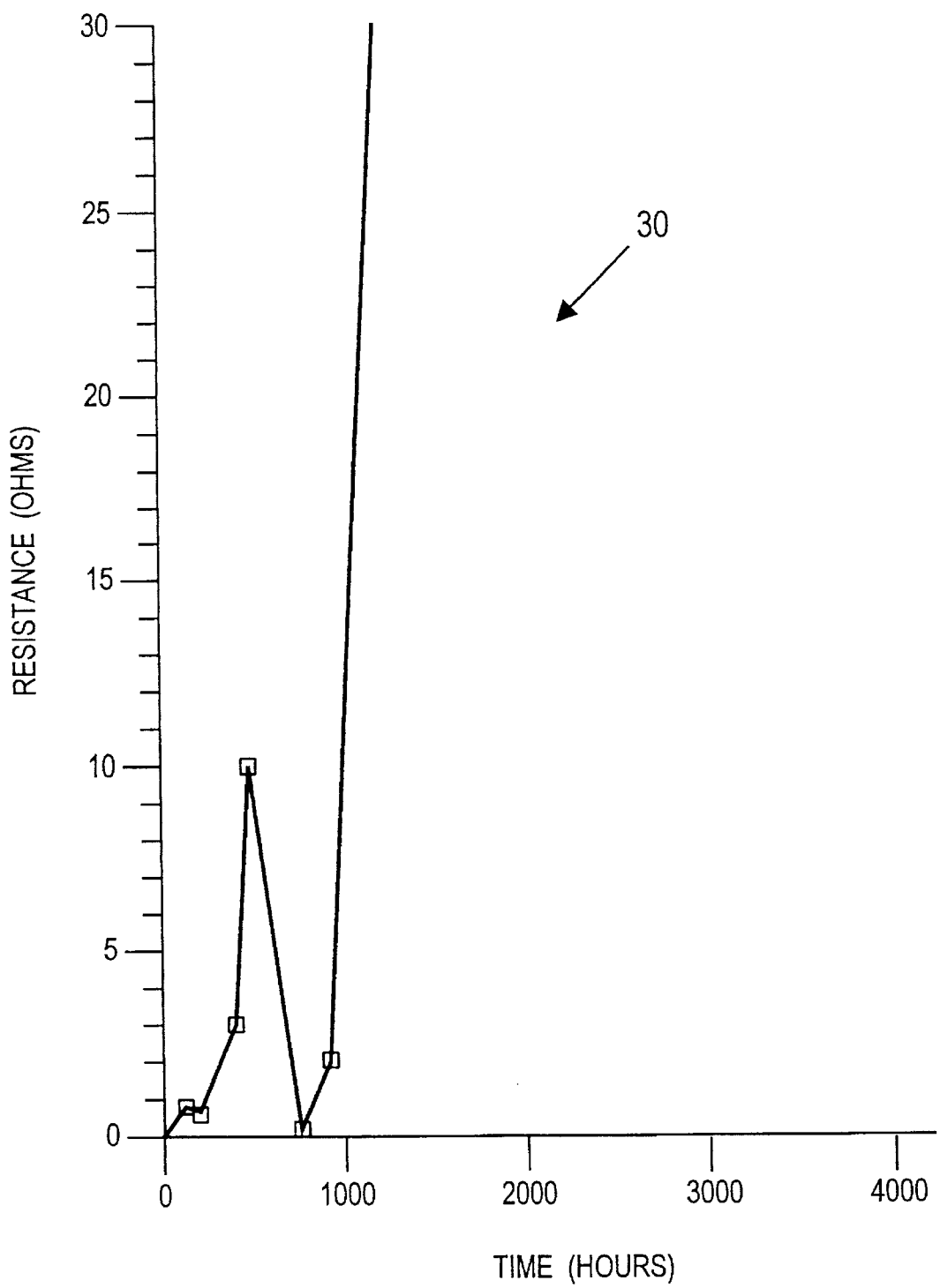
FIG. 3 is a graph showing electric resistance variation of silver flake with regard to time under temperature cycle 65° C./150°C.

Using respective adhesive composition prepared, a semiconductor chip was attached on a copper lead frame in which the brim of lead frame paddle was plated with silver (Ag) in a ring-plating technique in such a width as to allow down bond, as shown in FIG. 2.

The resulting attached bodies were tested for the bonding strength between the lead frame paddle and the semiconductor chip. Results of the test testified superiority of the die attach adhesive compositions containing copper oxide to the die attach adhesive composition without copper oxide in bonding strength. This is believed to be attributed to a fact that copper oxide is more compatible with copper than silver is.

After being subjected to T/C −65° C./150° C. five hundred times, the attached bodies were tested for electric conductivity and delamination. In case of Comparative Example C1, not only was the electric conductivity unstable, but also delamination occurred at the fillet portion of the adhesive. On the other hand, the adhesive compositions of Examples 1 to 4 kept their electric conductivity stable as well as did not show the delamination.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A copper oxide-filled polymer die attach adhesive composition for a semiconductor package comprising an adhesive epoxy resin monomer, an amine-based curing agent, an epoxide or butyl carbitol acetate diluent, a silane or dicyandimine adhesion promoter, thixotropic agent, and a copper oxide inorganic filler, wherein said inorganic filler is selected from the group consisting of CuO, $Cu_2O$ and the mixture thereof in an amount of approximately 50 to approximately 80% by weight of the overall composition.

2. The copper oxide-filled polymer die attach adhesive composition as set forth in claim 1, wherein said inorganic filler further comprises silver in an amount of 1 to 10% by weight.

3. A copper oxide-filled polymer die attach adhesive for semiconductor package which is prepared with the composition of claim 1, in a form of either paste or tape.

4. A copper oxide-filled polymer die attach adhesive for semiconductor package which is prepared with the composition of claim 2, in a form of either paste or tape.

5. A copper oxide-filled polymer die attach adhesive composition for attaching a semiconductor die to a lead frame paddle, said composition comprising organic components including an epoxy resin monomer, a curing agent, and a silane or silanol adhesion promote; and a copper oxide inorganic filler, wherein said inorganic filler is selected from the group consisting of CuO, $Cu_2O$ and the mixture thereof in an amount of approximately 50 to approximately 80% by weight of the overall composition.

6. The composition of claim 5 wherein the organic components of the composition comprise 70 parts by weight of said epoxy resin monomer and 30 parts by weight of said curing agent, said promoter and a thixotropic agent.

* * * * *